United States Patent
Anderson et al.

(10) Patent No.: US 7,274,073 B2
(45) Date of Patent: Sep. 25, 2007

(54) INTEGRATED CIRCUIT WITH BULK AND SOI DEVICES CONNECTED WITH AN EPITAXIAL REGION

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 219 days.

(21) Appl. No.: 10/711,844

(22) Filed: Oct. 8, 2004

(65) Prior Publication Data

US 2006/0076628 A1 Apr. 13, 2006

(51) Int. Cl.
*H01L 29/76* (2006.01)
*H01L 21/8238* (2006.01)

(52) U.S. Cl. ............... 257/373; 257/374; 257/509; 257/347; 257/513

(58) Field of Classification Search ............... None
See application file for complete search history.

(56) References Cited

U.S. PATENT DOCUMENTS

| | | | |
|---|---|---|---|
| 4,333,099 A | 6/1982 | Tanguay et al. | |
| 4,876,213 A | 10/1989 | Pfiester | |
| 5,066,995 A | 11/1991 | Young et al. | |
| 5,804,490 A | 9/1998 | Fiegl et al. | |
| 5,912,188 A | 6/1999 | Gardner et al. | |
| 5,956,597 A | 9/1999 | Furukawa et al. | |
| 5,963,803 A | 10/1999 | Dawson et al. | |
| 6,268,637 B1 | 7/2001 | Gardner et al. | |
| 6,479,368 B1 | 11/2002 | Mandelman et al. | |
| 6,555,891 B1* | 4/2003 | Furukawa et al. | 257/505 |
| 6,566,204 B1 | 5/2003 | Wang et al. | |
| 6,630,721 B1 | 10/2003 | Ligon | |
| 6,835,981 B2* | 12/2004 | Yamada et al. | 257/347 |
| 6,906,384 B2* | 6/2005 | Yamada et al. | 257/347 |
| 2002/0171468 A1 | 11/2002 | Bryant et al. | |
| 2003/0209765 A1 | 11/2003 | Lee et al. | |

OTHER PUBLICATIONS

Chan et al.; "On the Integration of CMOS with Hybrid Crystal Orientations"; 2004 Symposium on VLSI Technology, Digest of Technical Papers; pp. 160-161.

* cited by examiner

*Primary Examiner*—Sue A. Purvis
*Assistant Examiner*—Fazli Erdem
(74) *Attorney, Agent, or Firm*—Whitham, Curtis, Christofferson & Cook, PC; William D. Sabo

(57) ABSTRACT

An integrated circuit having devices fabricated in both SOI regions and bulk regions, wherein the regions are connected by a trench filled with epitaxially deposited material. The filled trench provides a continuous semiconductor surface joining the SOI and bulk regions. The SOI and bulk regions may have the same or different crystal orientations. The present integrated circuit is made by forming a substrate with SOI and bulk regions separated by an embedded sidewall spacer (made of dielectric). The sidewall spacer is etched, forming a trench that is subsequently filled with epitaxial material. After planarizing, the substrate has SOI and bulk regions with a continuous semiconductor surface. A butted P-N junction and silicide layer can provide electrical connection between the SOI and bulk regions.

13 Claims, 5 Drawing Sheets

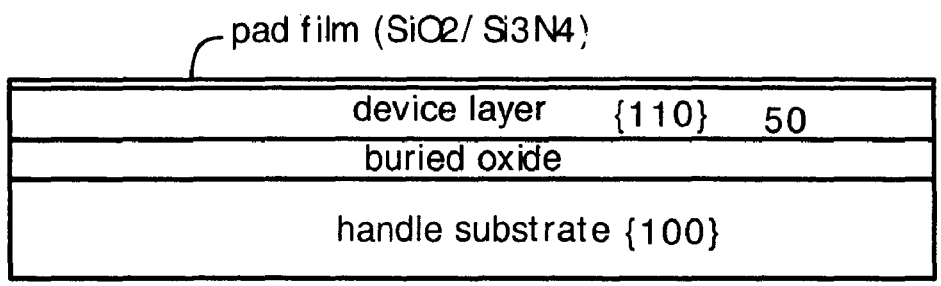
Fig. 3a SOI substrate with pad film
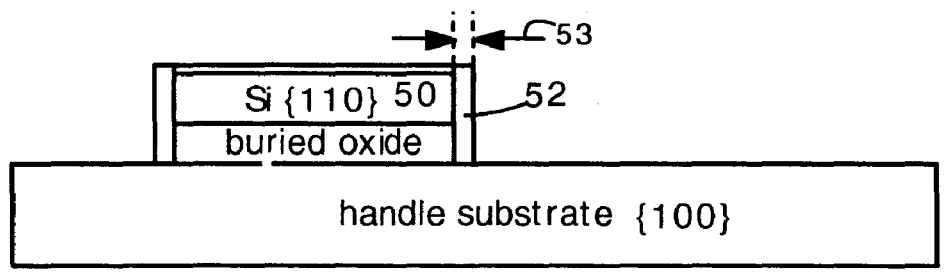
Fig. 3b Etch and form spacers
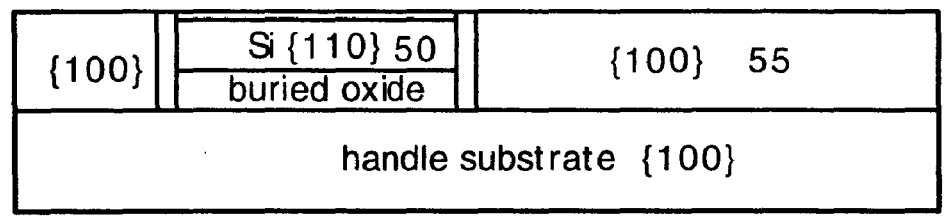
Fig. 3c Epitaxially grow substrate selectively
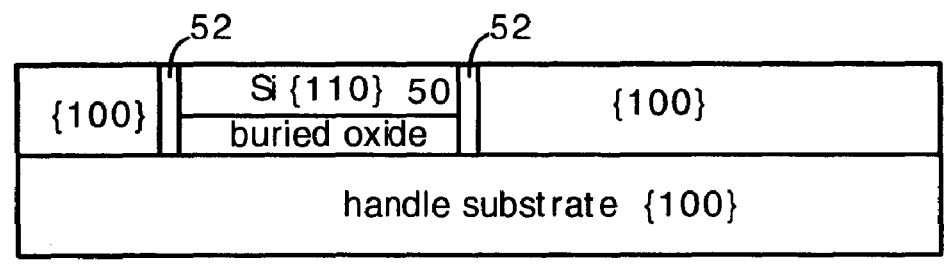
Fig. 3d Strip pad film and planarize

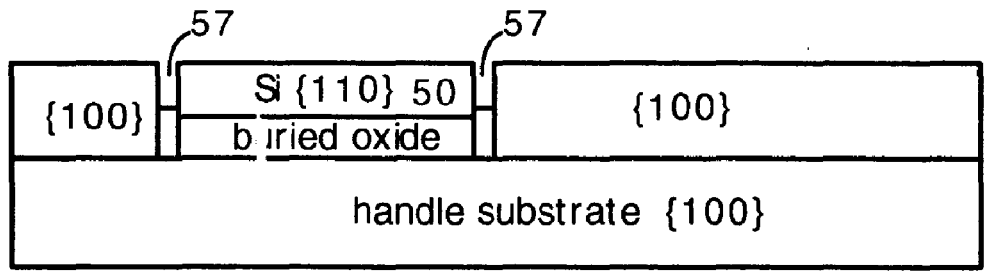
Fig. 3e Recess spacer with selective etch
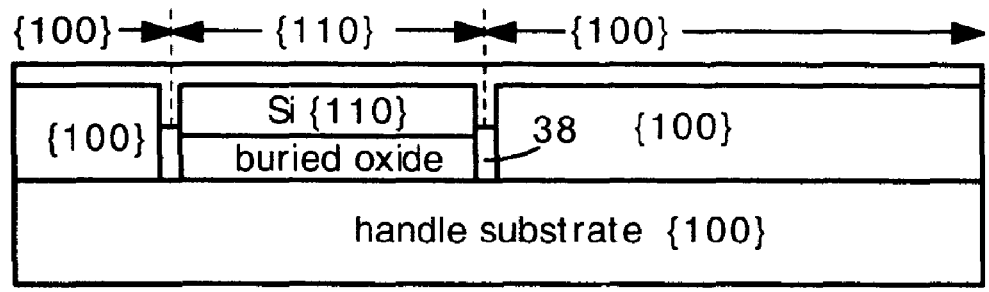
Fig. 3f Deposit epitaxial material to fill trench
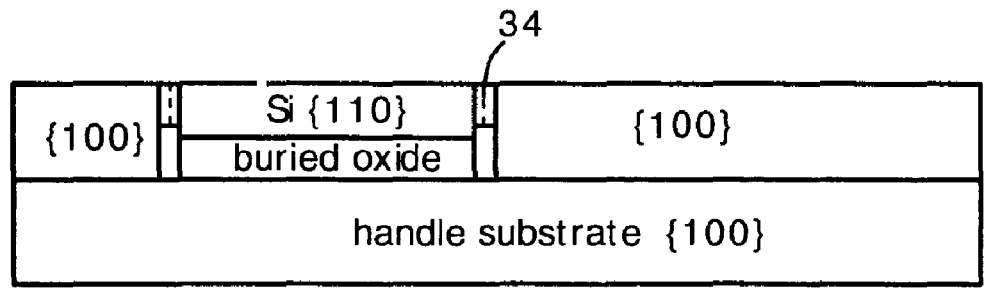
Fig. 3g Planarize
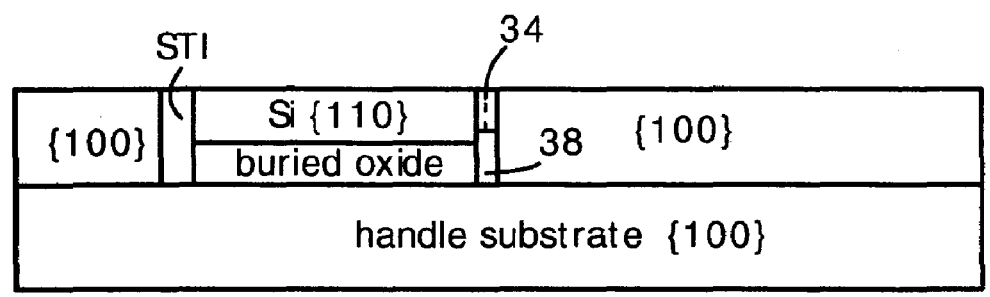
Fig. 3h Form shallow trench isolation STI

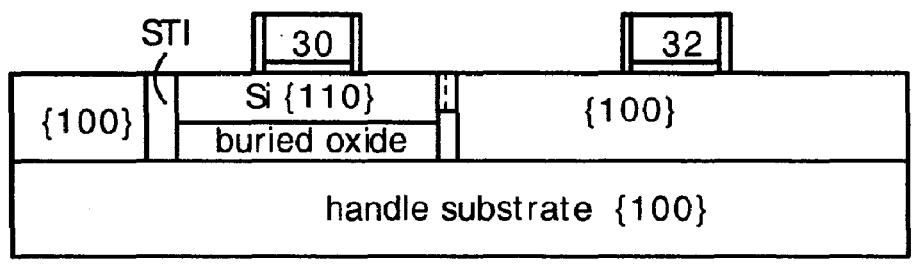
Fig. 3i Form gate electrodes and spacers
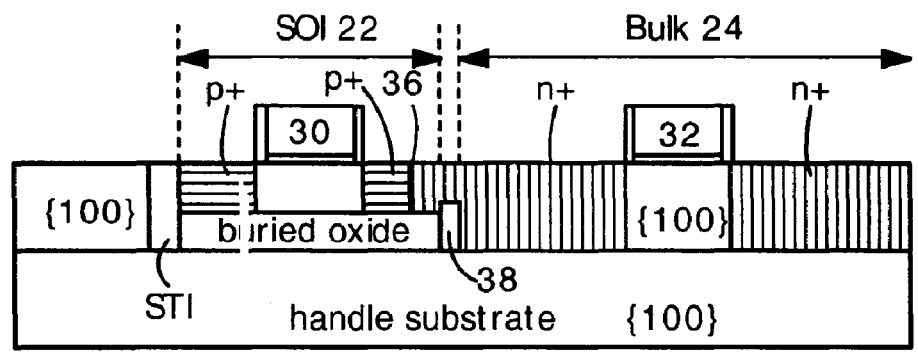
Fig. 3j Implant and form butted junction
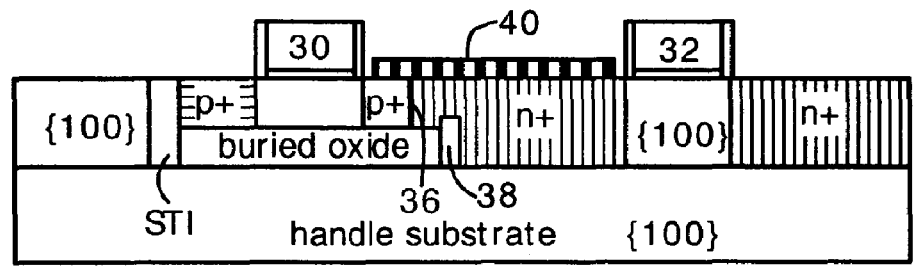
Fig. 3k Form silicide over butted junction
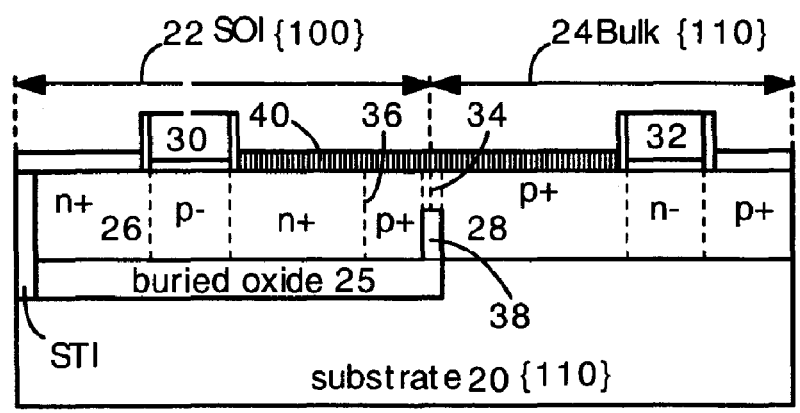
Fig. 4

INTEGRATED CIRCUIT WITH BULK AND SOI DEVICES CONNECTED WITH AN EPITAXIAL REGION

FIELD OF THE INVENTION

The present invention relates generally to integrated circuits and CMOS or FET devices. More specifically, the present invention relates to a CMOS chip with devices fabricated in bulk material, and devices fabricated in SOI material. The devices are connected with a butted silicide junction.

BACKGROUND OF THE INVENTION

Semiconductor devices are typically manufactured using one of two different types of semiconductor substrate: bulk substrate and silicon-on-insulator or semiconductor-on-insulator (SOI) substrate. Bulk fabricated devices employ a monolithic semiconductor substrate with no buried layers. SOI substrates have a buried layer of an insulating material, typically silicon dioxide (SiO2), under the electronic devices.

It is well known in the art that SOI and bulk fabricated devices have different benefits and different applications. For example, SOI devices can have the advantages of reduced parasitic capacitance and lower power consumption compared to bulk fabricated devices. In comparison, bulk fabricated devices can provide other advantages such as control of body voltage, which can be used to adjust the threshold voltage of an FET device. Also, bulk fabricated devices can typically have a lower manufacturing cost and higher power-handling capability. Therefore, the choice between SOI and bulk fabrication typically depends upon circuit application and performance requirements.

Integrated circuits using both SOI and bulk devices on a single wafer would provide the most useful solution for circuit designers because the advantages of both kinds of devices could be exploited. However, conventional wafer processing techniques make this task very difficult to accomplish. One significant problem with integrating SOI and bulk devices on a single substrate is making electrical connections between the devices. In the past, electrical connections between SOI and bulk device regions have been made in the wiring layers. Unfortunately, wiring layers for connecting the SOI and bulk devices increase the size of the circuit. This is particularly an issue for high-density memory circuits and microprocessors.

It would be an advance in the art to provide a simple, inexpensive method for fabricating both bulk and SOI devices on a single substrate. It would be particularly useful to provide small size electrical connections between the SOI and bulk devices on a single substrate.

It is also well known that crystal orientation can greatly affect the switching speed and current-carrying capability of field effect transistors and other semiconductor devices. For example, P-type complementary metal-oxide semiconductor (CMOS) transistors can have 2-3 times higher charge carrier mobility in {110}-oriented silicon compared to {100}-oriented silicon. Similarly, N-type CMOS devices can have about 2 times higher charge carrier mobility in {100}-oriented silicon compared to {110}-oriented silicon. A wafer with only {110} or only {100} crystal orientation therefore cannot provide both P-type and N-type devices with maximum carrier mobility. For maximum carrier mobility in both P-type and N-type devices, a wafer with both {110} and {100} regions is necessary.

Several methods are known for making hybrid substrates with both {110} and {100} regions. However, in prior hybrid wafer fabrication techniques it can be difficult to provide electrical connections across the {110} and {100} regions. In the past, electrical connections have been made using wiring layers, which is undesirable.

Therefore, it would be an advance in the art to provide a simple and inexpensive method for making devices having different crystal orientations on a single hybrid substrate. It would be particularly useful to provide small size connections between the regions of different crystal orientations.

SUMMARY OF THE INVENTION

The present invention provides a semiconductor integrated circuit having a semiconductor-on-insulator (SOI) region with a buried dielectric layer and a bulk semiconductor region adjacent to the SOI region. A trench filled with epitaxial semiconductor material is disposed at the boundary between the SOI region and bulk region. The SOI region and bulk region can have the same or different crystal orientations.

A buried sidewall spacer can be disposed under the filled trench.

The SOI region and bulk region can have different doping types. In this case, a butted P-N junction can be disposed in the SOI region or in the filled trench. A metal silicide layer can be disposed on the butted P-N junction. The metal silicide layer can extend over the SOI region and bulk region and provide an electrical connection between the regions.

The present invention also includes a method for forming a semiconductor integrated circuit with an SOI region and a bulk region. In the present method, separate SOI and bulk regions are formed. The SOI and bulk regions are separated by an embedded sidewall spacer. The sidewall spacer is etched to form an empty trench (the sidewall spacer may be completely removed or partially removed). Then, semiconductor material is epitaxially deposited in the trench.

The wafer is preferably planarized after the trench is filled with epitaxially deposited material. The SOI region and bulk region may be doped with different dopants, so that a P-N junction is formed in the trench or in the SOI region. A metal silicide layer may be deposited over the trench to form an electrical contact bridging the SOI region and bulk region.

DESCRIPTION OF THE FIGURES

FIGS. 3a-3k illustrate a preferred method for making the integrated circuit of the present invention.

FIG. 4 shows an alternative embodiment of the present invention.

DETAILED DESCRIPTION OF THE PREFERRED EMBODIMENTS

The present invention provides an integrated circuit having devices fabricated in both SOI regions and bulk regions. The SOI and bulk regions are separated by a trench filled with epitaxial material. The filled trench is a result of the present fabrication method. The filled trench provides a continuous semiconductor surface joining the SOI and bulk regions. The SOI and bulk regions may have the same or different crystal orientations. The present integrated circuit is made by first forming a substrate with SOI and bulk regions separated by an embedded sidewall spacer (e.g. made of $SiO_2$). The sidewall spacer is etched, forming a trench that is subsequently filled with epitaxial material. After planarizing, the substrate has SOI and bulk regions with a continuous semiconductor surface. FET and CMOS devices can be fabricated in both the SOI and bulk regions. Electrical connections can be provided across the SOI and bulk regions by doped regions and silicide layers. No wiring layers are needed to provide electrical connections between the SOI and bulk regions.

Figure 1:
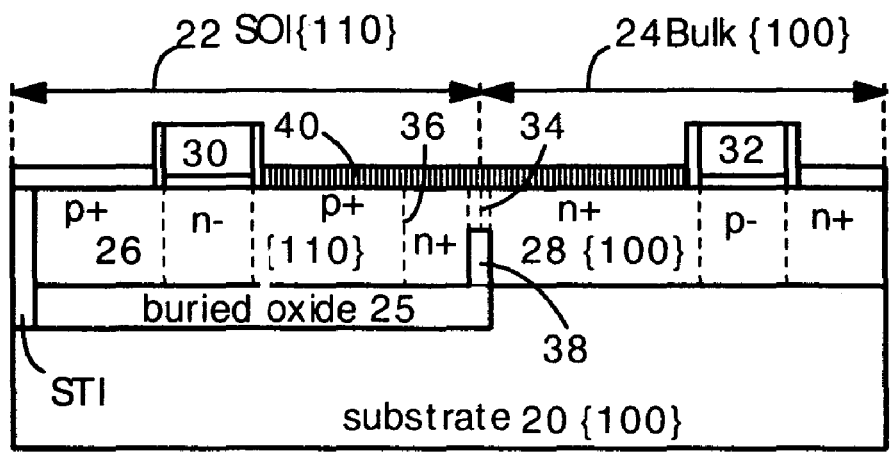
FIG. 1 shows a hybrid SOI/bulk CMOS integrated circuit device according to the present invention.

FIG. 1 shows a CMOS integrated circuit according to the present invention. The circuit has a substrate 20 with an SOI region 22 and a bulk region 24. The SOI region is disposed on a buried oxide layer 25 (e.g., comprising $SiO_2$). The SOI region has a device layer 26 which may have a {110} crystal orientation. The bulk region 24 has a device layer 28 which may have {100} crystal orientation. The bulk device layer 28 is preferably epitaxially grown on the substrate 20. The SOI and bulk regions have field effect transistors with gate electrodes 30 and 32. The gate electrodes 30 and 32 have spacers and gate dielectric layers, as are well known in the art. A shallow trench isolation structure STI is preferably formed around a portion of the SOI region 22.

An epitaxy filled trench 34 is disposed between the SOI region 22 and bulk region 24. The epitaxy filled trench 34 comprises epitaxially grown semiconductor material (e.g. epitaxially deposited silicon). In the embodiment described herein, at approximately the center of the epitaxy filled trench 34, the crystal orientation undergoes a transition between the {110} orientation of the SOI region and the {100} orientation of the bulk region. However, it should be understood that the SOI region 22 can have {100} or {111} crystal orientation, and the bulk region 24 can have {110} or {111} crystal orientation. Other crystal orientations can also be used. The crystal orientation of the SOI region 22 and bulk region 24 can be the same or different.

A buried sidewall spacer 38 is disposed under the epitaxy filled trench. The buried sidewall spacer 38 can comprise $SiO_2$, silicon nitride, silicon oxynitride or other dielectric materials known in the art. The buried sidewall spacer 38 is connected to, but may not be monolithic with the buried oxide layer 25 (i.e., the buried sidewall spacer may be formed in a separate process from the buried oxide layer 25). The buried sidewall spacer is directly underneath the epitaxy filled trench 34. The buried sidewall spacer 38 will typically have the same width as the epitaxy filled trench 34.

The SOI region 22 preferably has p+ doping adjacent to the gate electrode 30 and n− doping under the electrode, as is known in the art. The device layer 26 includes the p+ and n− doped regions. The bulk region 24 preferably has n+ doping adjacent to the gate electrode 32 and p− doping under the electrode, as is known in the art. The device layer 28 includes the n+ and p− doped regions. It is noted that the p+ and p− regions should not be in contact, and that the n+ and n− regions should not be in contact, as is known in the art. Such isolation is provided by making the n+ and p+ doped regions deep enough. Typically, the p+ regions should extend down to the buried oxide layer 25. The n+ regions should extend down to at least the top of the buried sidewall spacer 38.

A P-N butted junction 36 is formed at the boundary of the p+ and n+ doped regions. The P-N butted junction is disposed in the SOI region 22 in FIG. 1.

A metal silicide layer 40 is formed on the p+ and n+ doped regions. The silicide layer 40 bridges the P-N junction and provides an ohmic contact between the p+ and n+ doped regions.

The present circuits can be made of silicon or other semiconductor materials such as gallium arsenide, silicon carbide. The STI structure, buried oxide layer 25, gate electrodes and other dielectric structures can be made of $SiO_2$, silicon nitride or other dielectric materials known in the art.

In operation, the circuit of FIG. 1 provides the benefits of both SOI devices and bulk devices. Both SOI devices and bulk devices are integrated on a single substrate.

Also, the metal silicide layer 40 provides electrical connections between the SOI region 22 and bulk region 24. Hence, wiring layers are not required to electrically connect the SOI region 22 and bulk region 24, as in the prior art.

Also, since the SOI region and bulk region can have different crystal orientations, the devices in each region can be optimized for a specific crystal orientation. For example, the CMOS device in the SOI region (i.e. with gate 30) can be a p-type FET that tends to have a higher mobility in {110} orientated crystal. The CMOS device in the bulk region (i.e. with gate 32) can be an n-type FET that tends to have a higher mobility in {100} oriented crystal.

The benefits of the present invention are made possible by the epitaxy filled trench 34. The epitaxy filled trench 34 provides a smooth semiconductor surface between the SOI region 22 and bulk region 24. Since the boundary between the SOI region 22 and bulk region 24 does not have a dielectric-filled trench, a metal wiring layer is not required for electrical connection between the two regions 22 and 24. In other words, the epitaxy filled trench allows the metal silicide layer 40 to provide electrical connections between the two regions 22 and 24.

Figure 2A:
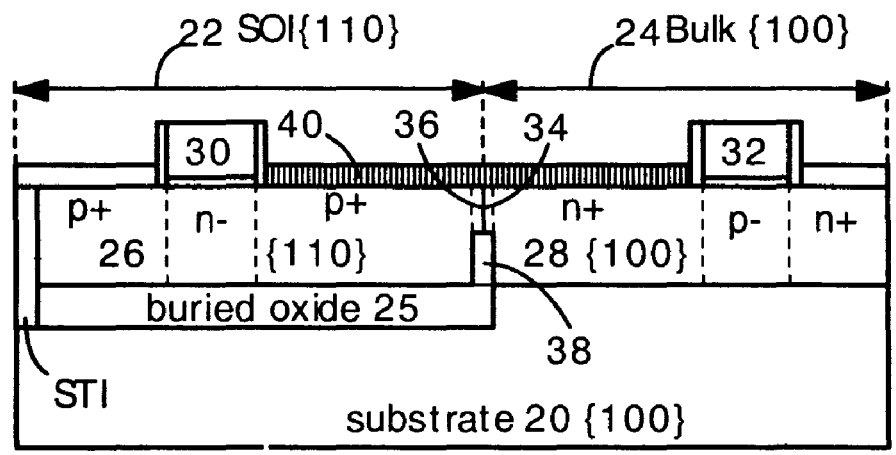
FIG. 2a shows an embodiment of the invention in which a P-N butted junction overlaps a boundary between SOI and bulk device regions.

FIG. 2a shows an alternative embodiment of the invention in which the P-N butted junction is disposed within the epitaxy filled trench 34. In the present invention, the P-N butted junction can be located in the SOI region 22 or within the epitaxy filled trench 34. Since the P-N butted junction 36 is disposed in the SOI region 22, it provides an electrical connection for the p+ doped region to the n+ doped region without a short circuit to the substrate 20. If the P-N butted junction is located in the bulk region, a short circuit to the substrate will be created and the device will be inoperable. Hence, the P-N butted junction cannot be located within the bulk region 24. Also, in the device of FIG. 2a, the n+ doped region must extend down to the buried sidewall spacer 38.

Figure 2B:
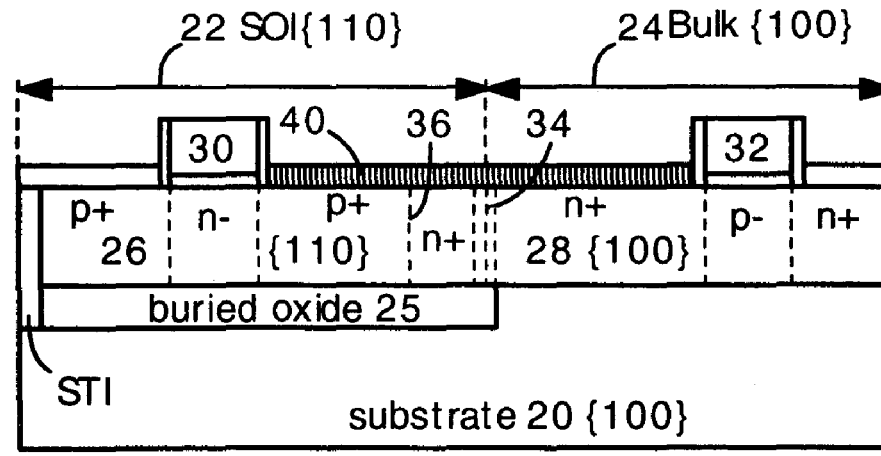
FIG. 2b shows an embodiment of the invention in which an epitaxy filled trench extends down to a buried oxide layer of the SOI region.

FIG. 2b shows an alternative embodiment of the invention that does not have the buried sidewall spacer. The device of FIG. 2b will operate in essentially the same manner as the device of FIG. 1. In this embodiment, it is necessary for the n+ doping region to extend all the way down to the buried oxide 25 so that p+ and p− regions are isolated, and so that n+ and n− regions are isolated.

FIGS. 3a-3j illustrate a preferred method for making the integrated circuits of the present invention. These figures are described below.

FIG. 3a: The present method begins with an SOI wafer having a buried oxide layer. If different crystal orientations are desired for the SOI and bulk regions, then the device layer 50 must be made from a bonded wafer having a different crystal orientation than the handle substrate. In the present invention, the crystal orientation of the SOI region 22 is the same as the crystal orientation of the device layer. If the SOI region and bulk are to have the same crystal orientation, then the buried oxide layer can be made by oxygen implantation. A pad film (e.g. 10 nm SiO2 with 40 nm of Si3N4) is disposed on the device layer 50. The device layer 50 can have a thickness of about 15 nm to 100 nm.

FIG. 3b: The wafer is etched to expose the handle substrate. Sidewall spacers 52 are formed on the sidewalls of the remaining portions of the device layer and buried oxide layer. The sidewalls spacers can comprise SiO2 or other dielectric materials. The sidewall spacers 52 can have a width 53 of about 5 nm to 30 nm.

FIG. 3c: Epitaxial silicon 55 is selectively grown on the handle substrate. The epitaxial silicon is grown until it is level with or above the device layer 50.

FIG. 3d: The pad film is stripped and the substrate is planarized. The substrate surface has SOI and bulk regions separated by sidewall spacers 52.

FIG. 3e: Sidewall spacers 52 are recessed by a selective etch. The selective etch can be a wet chemical etch or plasma etch, for example. Etching of the sidewall spacers forms a trench 57. The sidewall spacers can be partially removed (as illustrated) or can be completely removed. The sidewalls spacers can be about 50% removed by the etch. Completely removing the sidewall spacers will ultimately create the embodiment illustrated in FIG. 2b.

FIG. 3f: Epitaxial growth is performed. The trench 57 is epitaxy filled with semiconductor material. In the embodiment illustrated, the SOI region has a {110} epitaxial layer grown, and the bulk region has a {100} layer grown. A boundary between the {110} and {100} regions is located approximately in the center of the trench 57. Preferably, the trench is filled without voids. The epitaxial deposition buries the unetched portion of the sidewall spacers, thereby forming the buried sidewall spacers 38.

FIG. 3g: The substrate is planarized. Preferably, (but optionally) all the epitaxially deposited material is removed from the SOI and bulk regions. The substrate now has a continuous silicon surface with regions of different crystal orientation.

FIG. 3h: Shallow trench isolation (STI) is formed in some regions of the epitaxy filled trench. The shallow trench isolation STI can be created according to many techniques known in the art. For example, reference can be made to U.S. Pat. Nos. 5,804,490 and 6,479,368 (hereby incorporated by reference) for more information on how to create a shallow trench isolation. Also, the SOI and bulk regions can be lightly implanted to form p− and n− regions (not illustrated).

FIG. 3i: Gate electrodes 30 and 32 and spacers are formed, as known in the art.

FIG. 3j: Implantation is performed to create p+ and n+ doped regions and P-N butted junction 36. Preferably, the implantation mask is located so that the butted junction 36 is located in the SOI region 22. The butted junction 36 can alternatively be located over the buried sidewall spacer 38 (and overlapping the epitaxy filled trench). However, it is more difficult to design for this junction placement because errors in mask alignment could cause the butted junction to be located in the bulk region, and this would cause circuit malfunction (due to contact between p+ doped region and substrate 20).

FIG. 3k: The metal silicide layer 40 bridging the butted junction 36 is formed. The metal silicide may be any of cobalt, titanium, tungsten, nickel, platinum, or similar silicide. The silicide layer 40 provides an Ohmic connection across the butted junction.

Of course, the doping polarity can be reversed from that shown in FIGS. 1 and 2a-2c. FIG. 4, for example, shows an embodiment of the present invention having an N-type device in the SOI region 22 and a P-type device in the bulk region.

Figure 5:
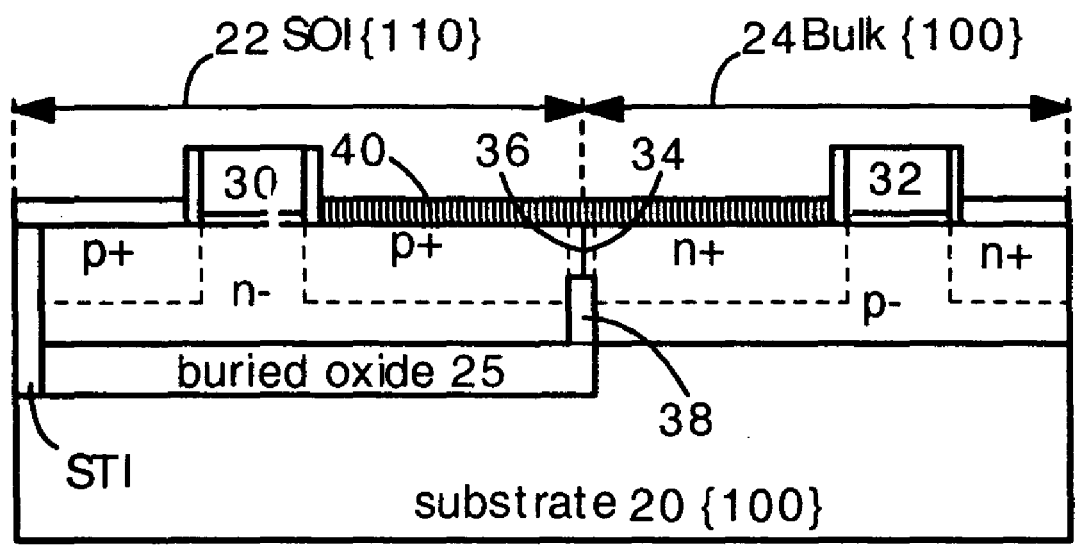
FIG. 5 shows an alternative embodiment of the present invention in which p+ and n+ doped regions do not extend deeply.

FIG. 5 shows an alternative embodiment of the present invention in which the p+ and n+ doped regions do not extend down to the level of the buried oxide layer 25. Isolation (e.g. isolation between p+ and p− regions) is provided because the p+ and n+ regions extend to a level below the buried sidewall spacer 38.

It will be clear to one skilled in the art that the above embodiment may be altered in many ways without departing from the scope of the invention. Accordingly, the scope of the invention should be determined by the following claims and their legal equivalents.

What is claimed is:

1. A semiconductor integrated circuit, comprising:
   a) a semiconductor-on-insulator (SOI) region with a buried dielectric layer;
   b) a bulk semiconductor region adjacent to the SOI region;
   c) a trench filled with epitaxial semiconductor material disposed between the SOI region and bulk region
      wherein said epitaxial semiconductor material has a crystal orientation corresponding to crystal orientation of said SOI region adjacent said SOI region and a crystal orientation corresponding to said bulk semiconductor region adjacent said bulk semiconductor region and includes a transition of crystal orientation at approximately a center of said epitaxial semiconductor material if said crystal orientation of said SOI region and said crystal orientation of said bulk semiconductor region are different.

2. The semiconductor integrated circuit of claim 1 further comprising a buried sidewall spacer between the SOI region and bulk region, and disposed under the trench filled with epitaxial semiconductor material.

3. The semiconductor integrated circuit of claim 1 further comprising:
   a) a first type doping in the bulk region;
   b) a second type doping in the SOI region;
   c) a butted P-N junction between the first-type doping and second type doping, wherein the butted junction is disposed in the SOI region, or in the filled trench.

4. The semiconductor integrated circuit of claim 3 wherein the first type doping extends into the SOI region.

5. The semiconductor integrated circuit of claim 3 wherein the trench filled with epitaxial semiconductor material has the first type doping.

6. The semiconductor integrated circuit of claim 3 further comprising a metal silicide layer disposed on the butted P-N junction.

7. The semiconductor integrated circuit of claim 6 wherein the metal silicide layer is disposed on a portion of the bulk region having the first type doping and on a portion of the SOI region having the second type doping.

8. The semiconductor integrated circuit of claim 1 wherein the SOI region and bulk region have different crystal orientations.

9. The semiconductor integrated circuit of claim 8 wherein the SOI region and bulk region are made of silicon, and wherein the SOI region has a {110} crystal orientation, and the bulk region has a {100} crystal orientation.

10. A semiconductor integrated circuit, comprising:
   a) a semiconductor-on-insulator (SOI) region with a buried dielectric layer;
   b) a bulk semiconductor region adjacent to the SOI region;
   c) a P-N junction formed from a first type doping in the bulk region and a second type doping in the SOI region;
   d) a metal silicide layer disposed on and electrically bridging the P-N junction
   wherein epitaxial semiconductor material has a crystal orientation corresponding to crystal orientation of said SOI region adjacent said SOI region and a crystal orientation corresponding to said bulk semiconductor region adjacent said bulk semiconductor region and includes a transition of crystal orientation at approximately a center of said epitaxial semiconductor material if said crystal orientation of said SOI region and said crystal orientation of said bulk semiconductor region are different.

11. The semiconductor integrated circuit of claim 10 wherein the P-N junction is disposed in the SOI region.

12. The semiconductor integrated circuit of claim 10 wherein the P-N junction is disposed at the trench filled with epitaxial semiconductor material.

13. The semiconductor integrated circuit of claim 10 further comprising a trench filled with epitaxial semiconductor material disposed between the SOI region and bulk region.

* * * * *